(12) United States Patent
Frankowsky et al.

(10) Patent No.: US 6,696,319 B2
(45) Date of Patent: Feb. 24, 2004

(54) METHOD OF ATTACHING SEMICONDUCTOR DEVICES ON A SWITCHING DEVICE AND SUCH AN ATTACHED DEVICE

(75) Inventors: Gerd Frankowsky, Höhenkirchen-Siegertsbrunn (DE); Thorsten Meyer, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/244,256

(22) Filed: Sep. 16, 2002

(65) Prior Publication Data

US 2003/0085474 A1 May 8, 2003

(30) Foreign Application Priority Data

Sep. 14, 2001 (DE) ......................................... 101 45 468

(51) Int. Cl.[7] .............................................. H01L 21/44
(52) U.S. Cl. ...................... 438/108; 438/118; 438/598
(58) Field of Search ................................. 438/106, 108, 438/118, 598, 612; 257/777, 779

(56) References Cited

U.S. PATENT DOCUMENTS

| 5,148,266 A | 9/1992 | Khandros et al. | |
|---|---|---|---|
| 5,783,465 A | 7/1998 | Canning et al. | |
| 5,885,849 A | 3/1999 | DiStefano et al. | |
| 5,950,072 A | 9/1999 | Queyssac | |
| 6,080,605 A | 6/2000 | Distefano et al. | |
| 6,144,558 A | * 11/2000 | Shiota et al. | 361/760 |
| 6,309,915 B1 | * 10/2001 | Distefano | 438/127 |
| 6,498,503 B2 | * 12/2002 | Akram et al. | 324/754 |
| 6,521,480 B1 | * 2/2003 | Mitchell et al. | 438/108 |

FOREIGN PATENT DOCUMENTS

| DE | 100 16 132 A1 | 10/2001 |
|---|---|---|
| WO | WO 00/54321 | 9/2000 |
| WO | WO 01/09939 A1 | 2/2001 |

OTHER PUBLICATIONS

Novitsky, J. et al.: "Wafer–Level CSP, Wafer–Level Assembly/Test: Integrating Backend Processes", Solid State Technology, Feb. 2001, pp. 78–85.
Burggraf, P.: "Chip Scale and Flip Chip: Attractive Solutions", Solid State Technology, Jul. 1998, pp. 239–246.

* cited by examiner

Primary Examiner—Craig A. Thompson
Assistant Examiner—David S Blum
(74) Attorney, Agent, or Firm—Laurence A. Greenburg; Werner H. Stemer; Gregory L. Mayback

(57) ABSTRACT

A method of attaching semiconductor devices, the contact devices of which have preferably already been applied at wafer level, on a switching device and such a device includes having the electrical contacts remain free of solder by using flexible contact elements, and performing the mechanical attachment by additional attachment elements or compression stops used as attachment elements.

18 Claims, 4 Drawing Sheets

Phase 3:

Phase 1:

Phase 2:

Phase 3:

Phase 1:

Phase 2:

Phase 3:

Phase 1:

Phase 2:

Phase 3:

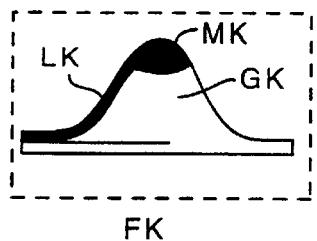
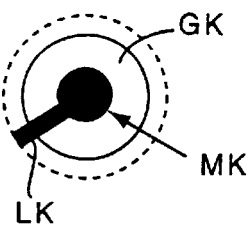
FIG. 4A  FIG. 4B
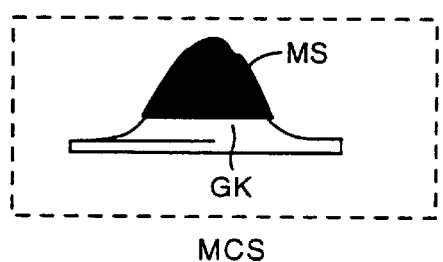
FIG. 5
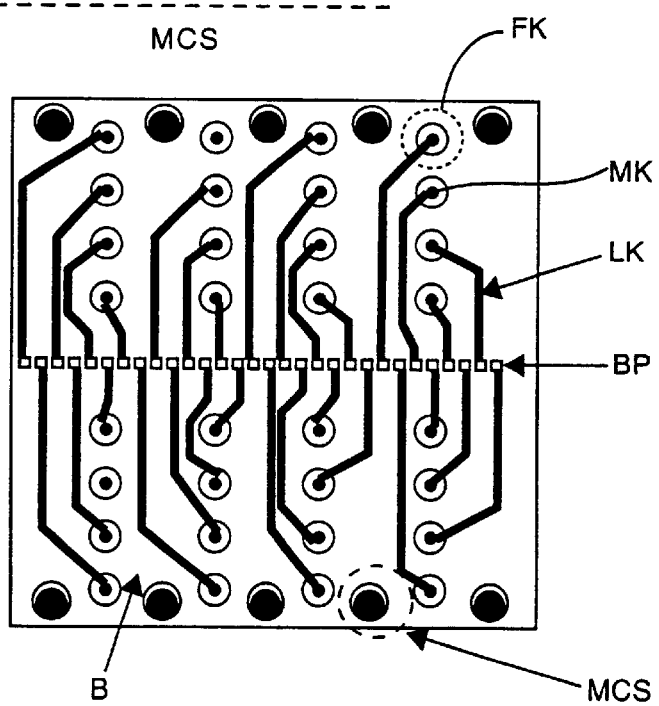
FIG. 6
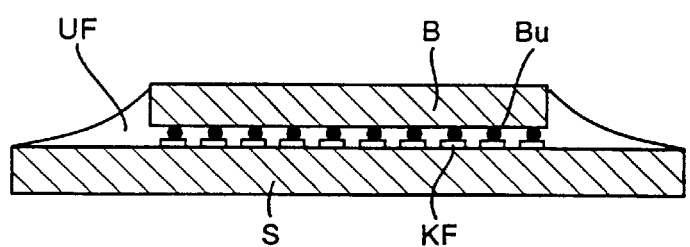
FIG. 7

METHOD OF ATTACHING SEMICONDUCTOR DEVICES ON A SWITCHING DEVICE AND SUCH AN ATTACHED DEVICE

BACKGROUND OF THE INVENTION

Field of the Invention

The present invention relates to a method of attaching semiconductor devices with contact devices on a switching device and to an apparatus including a switching device and a semiconductor device attached according to the method.

The contact devices of semiconductor devices may be applied to the latter already at wafer level (wafer level package). By the subsequent sawing of the wafer, individually separated semiconductor devices (hereafter referred to as components) are obtained. The attachment (hereafter also referred to as placement) of such components on the switching devices conventionally takes place by flip-chip technology. The contact devices are provided on the component, for example, as spherical solder bumps measuring approximately 0.1 mm in diameter of eutectic Sn—Pb solder. These solder bumps are soldered to contact areas lying on the surface of the switching device opposite the solder bumps during placement of the component. The soldering achieves the effect that the component is both electrically bonded and mechanically attached.

A disadvantage of such a method is the rigidity of the solder or the soldered connection under thermal loading of the component soldered on the switching device. The coefficient of thermal expansion of the component and of the switching device differ by several ppm/K, typically, approximately 15 ppm/K. In the case of a permissible temperature range for the component of −10° C. to +25° C., this corresponds to a thermally induced expansion of the component, on one hand, and the switching device, on the other hand, differing by approximately 45 $\mu$m. Due to the rigid soldered connections, the material of the component cannot contract and expand in a way corresponding to the thermal conditions. Thermomechanical stresses occur in the component in the region of the contact devices. These stresses may lead to tearing away of the soldered connection or damage in the electrical structures of the component and failure of the component.

Such a problem is conventionally solved by underfilling the placed component with an underfiller. The underfiller is pressed as a viscous paste between the component and the switching device after placement, by following the contours of the component, and is subsequently cured. If a placed component that has been so underfilled is subjected to thermal loading, the thermally induced mechanical stresses are distributed evenly over the entire surface of the component and the soldered connections are relieved. Disadvantages of the underfilling method are the expenditure, which the process of underfilling as such requires during production and the requirements on the underfilling itself.

In the case of a conventional possible way of avoiding the underfilling of components, flexible electrical contact elements are already provided at wafer level as contact devices on the semiconductor device. For such a purpose, a basic body several 10 $\mu$m high of an initially plastic polymer, preferably, silicone, is applied per contact element by a template to the surface of the semiconductor device facing the switching device and is subsequently cured. After that, the crest of the spherical basic body of the now elastic polymer is metallized and a conductor track is subsequently provided between the metallized crest and a bonding pad by a conventional technique.

If a component provided with such of flexible contact elements is soldered, the electrical connection remains mechanically flexible. Under thermal loading, the material of the component and of the switching device can expand differently. The elastic basic body of the contacts absorbs the thermally induced mechanical stresses and the thermomechanical loading of the semiconductor device and of the soldered connection is significantly reduced.

A disadvantage of such a method is the fact that the solder can creep onto the conductor track between the crest of the contact element and the bonding pad during the soldering process. A conductor track covered with solder loses mechanical flexibility and can be interrupted by the mechanical stresses occurring under thermal loading.

International publication WO 00/54321 describes a method of attaching a semiconductor component on a chip carrier, in which, at least during the soldering of the contacts of the semiconductor component to the contact devices of the chip carrier, contacts of the semiconductor device that do not have any electrical function are adhesively bonded to the surface of the chip carrier.

U.S. Pat. No. 5,148,266 to Khandros et al. discloses soldered connections between a semiconductor component and a substrate, with flexible contact devices being fixed at one end of the semiconductor component and soldered on the substrate at the other end. In such a case, however, thermally induced mechanical stresses load and fatigue the soldered joint between the substrate and the flexible contact element.

U.S. Pat. No. 5,885,849 to DiStefano et al. describes a method in which these soldered joints are provided in a circular and concavely constricted manner, whereby the mechanical stresses at the soldered joint are minimized. Along with the flexible contacts disclosed, inter alia, from DiStefano et al., a series of further flexible contact elements also exist in the art.

Novitsky, J.; Miller, C.: Wafer-level CSP, wafer-level assembly/test: Integrating backend processes. In: Solid State Technology, February 2001, pages 78–85, discloses flexible contact devices including a gold wire, which are thermosonically applied to the contact areas (pads) of the semiconductor component.

German Published, Non-Prosecuted Patent Application DE 100 16 132 A1 discloses flexible contact elements, on which an electrical contact is disposed on the tip of a cone of an elastic material.

U.S. Pat. No. 5,783,465 to Canning et al. discloses a similar contact device, in which the material of the cone is a polymer.

A semiconductor component described in U.S. Pat. No. 5,950,072 to Queyssac likewise has flexible contact elements. The flexibility is obtained by the fact that solder balls (solder bumps) provided for the soldering are attached on contact areas located on the semiconductor element by a conductive, thermoplastic adhesive.

All the methods and configuration mentioned share the common feature that the electrical contact elements of the substrate and semiconductor element are ultimately soldered to one another, or have been soldered.

A general disadvantage of soldered connections is also that of the high soldering temperatures, in particular, when novel, lead-free solders are used. The soldering temperatures of 240° C. occurring in such a case lie well above the required temperature range of the component in the application, subject it to considerable loading and may lead to the failure of the component.

If a defective soldered component has to be removed again from the switching device, it has to be desoldered. In addition, the remains of the soldering agent on the contact areas have to be removed.

SUMMARY OF THE INVENTION

It is accordingly an object of the invention to provide a method of attaching semiconductor devices on a switching device and such a semiconductor device that overcome the hereinafore-mentioned disadvantages of the heretofore-known devices and methods of this general type and that in which the electrical contact devices of the semiconductor device and of the switching device remain free of solder.

With the foregoing and other objects in view, there is provided, in accordance with the invention, a method of attaching a semiconductor device on a switching device, including the steps of providing a semiconductor device with at least two electrical contact devices on a surface, providing a switching device with at least two electrical contact devices on a surface, forming the electrical contact devices on one of the two surfaces as flexible contact elements having a given expansion in a compressed state of the flexible contact elements, forming the electrical contact devices on the other of the two surfaces as contact areas, applying at least one attachment element to one of the two surfaces, the at least one attachment element having an expansion in a direction perpendicular to the one surface corresponding to the given expansion, and facing the semiconductor device towards the switching device to place the respective electrical contact devices opposite one another, pressing the flexible contact elements onto the contact areas, and securely connecting the at least one attachment element to an opposing other one of the two surfaces.

With the objects of the invention in view, there is also provided a method for attaching a semiconductor device on a switching device including the steps of:

a) preparing a semiconductor device, having at least two bonding pads on a surface, and a switching device, with likewise at least two electrical contact areas on a surface facing the semiconductor device to be attached;

b) producing basic bodies for attachment elements and for flexible contact elements from elastic polymer by applying polymer to the semiconductor device by a perforated mask and subsequent curing;

c) forming the flexible contact elements by metallizing crests of the basic bodies;

d) forming conductor tracks between the metallized crests of the basic bodies and the corresponding bonding pads of the semiconductor device;

e) aligning the semiconductor device and the switching device with respect to one another;

f) pressing the flexible contact elements of the semiconductor device onto the contact areas lying opposite of the switching device; and g) connecting the attachment element securely to the surface lying opposite, in the compressed state of the flexible contact elements.

In accordance with another mode of the invention, the pressing step is carried out by pressing the flexible contact elements of the semiconductor device onto the at least two electrical contact areas.

In the case of the method according to the invention or the apparatus according to the invention, not only flexible electrical contact elements but also additional attachment elements with no electrical function are, consequently, provided. In the actual placement process, the attachment elements are attached on the surface lying opposite them, while the flexible electrical contact elements are pressed on the contact areas located on the surface lying opposite them.

In accordance with a further mode of the invention, both the flexible contact elements and the attachment elements are provided in the same way on the semiconductor device already at wafer level. The flexible contact elements are formed on the surface of the semiconductor device and the attachment element is applied to the semiconductor device.

In accordance with an added mode of the invention, the semiconductor device is provided with bonding pads, the flexible contact elements and the attachment element are applied to the semiconductor device by applying a polymer to the surface of the semiconductor device with a perforated mask and subsequently curing the polymer to produce basic bodies of elastic polymer, the basic bodies having crests, the flexible contact elements are created by metallizing the crests of the basic bodies, and conductor tracks are applied between the metallic crests of the basic bodies and corresponding ones of the bonding pads.

For applying the flexible contact devices or the attachment elements, a polymer that is plastic in the uncured state, elastic in the cured state, and adheres on the surface of the semiconductor device, preferably, silicone, is applied by a perforated mask to the surface of the semiconductor device facing the surface of the switching device. After curing, an elastic, preferably, conical, basic body several $\mu$m high remains.

In accordance with an additional mode of the invention, the flexible contact elements are applied at an inner contact field of the semiconductor device and at least two attachment elements are provided in a region of the semiconductor device between an edge of the semiconductor device and the inner contact field.

In accordance with yet another feature of the invention, the flexible contact elements are produced from the basic body by metallizing their crests, preferably, with a gold alloy, and applying conductor tracks of the same material leading from the metallized crests to the corresponding bonding pads with a conventional technique.

Preferably, the attachment elements are metallized.

In accordance with yet a further feature of the invention, in the simplest case, the attachment elements are metallized or unmetallized conical basic bodies and are several $\mu$m lower than the basic bodies of the flexible contact elements. They are disposed at the edges of the components individually separated by sawing the wafer.

If mechanical stops formed by the same technique for limiting the compressive displacement of the flexible contact elements (compression stops) are already provided on the component, they are used with preference as attachment elements.

In accordance with yet an added mode of the invention, the metallized or unmetallized attachment elements are adhesively bonded on the surface lying opposite of the switching device by a suitable adhesive, preferably, by an epoxy resin adhesive. In such a case, the adhesive may be applied before placement either to the attachment element itself or to the surface lying opposite the attachment element.

In accordance with yet an additional mode of the invention, both the crests of the attachment elements on the semiconductor device and the regions lying opposite the attachment elements on the switching device are metallized. During the actual placement, the attachment elements are soldered to these metallized areas lying opposite. Because the basic bodies of the attachment elements remain elastic, the placed component can expand or contract unhindered under thermal loading, without the possibility of the conductor tracks wetted with solder being torn away. The thermal reliability is, therefore, maintained. The exchange of a defective placed component is simplified by the fact that the electrical contact elements remain free of solder and the amount of solder at the soldered connections between the contact areas and the placement element is uncritical.

With the objects of the invention in view, there is also provided a method of attaching a semiconductor device on a switching device, including the steps of providing a semiconductor device with at least two electrical contact devices on a surface, providing a switching device with at least two electrical contact devices on a surface, forming the electrical contact devices on one of the two surfaces as flexible contact elements having a given expansion in a compressed state of the flexible contact elements, forming the electrical contact devices on the other of the two surfaces as contact areas, applying at least one attachment element to one of the two surfaces, the at least one attachment element having an expansion in a direction perpendicular to the one surface corresponding to the given expansion, and facing the semiconductor device towards the switching device to place the respective electrical contact devices opposite one another, pressing the semiconductor device and the switching device to contact the flexible contact elements and the contact areas with one another, and securely connecting the at least one attachment element to an opposing other one of the two surfaces.

The method can be used for all types of components of which the contact devices are already applied at wafer level.

With the objects of the invention in view, there is also provided a switching device having at least one switching surface and at least two contact devices on the at least one switching surface, at least one semiconductor device having a surface and at least two contact devices on the surface, the at least one semiconductor device being connected to the switching device to dispose the at least two contact devices on the surface opposite the at least two contact devices on the at least one switching surface and to compress the flexible contact elements perpendicularly with respect to one of the switching surface and the surface, the at least two contact devices on one of the switching surface and the surface being flexible contact elements, the flexible contact elements having a compressed state and a given expansion in the compressed state, the at least two contact devices on another of the switching surface and the surface being contact areas disposed opposite the flexible contact elements, and at least one attachment element applied to one of the switching surface and the surface and connected to another one of the switching surface and the surface, the at least one attachment element having an expansion perpendicular to the one of the switching surface and the surface substantially corresponding to the given expansion.

In a corresponding way, an apparatus according to the invention includes a switching device with at least two contact areas on at least one surface and at least one semiconductor device placed thereon, having at least two bonding pads, from which metallized conductor tracks lead to at least two flexible contact devices on the surface lying opposite the switching device, the flexible contact devices of the semiconductor device and the contact areas on the surface of the switching device lying opposite one another, the flexible contact elements including a basic body of a cured polymer with a metallized crest in each case, the flexible contact elements being compressed perpendicularly in relation to the surface, and at least one attachment element including a basic body of a cured polymer, and the expansion of the attachment element perpendicular to the surface corresponding to the corresponding expansion of the flexible contact elements in the compressed state.

With the objects of the invention in view, there is also provided an apparatus, including a switching device having a switching surface, at least one semiconductor device attached to the switching surface, the at least one semiconductor device having a surface opposite the switching surface and at least two first flexible contact devices on the surface, at least two contact areas on the switching surface, at least two bonding pads, at least two second flexible contact devices, metallized conductor tracks connecting the at least two bonding pads to the at least two second flexible contact devices and leading to the at least two first flexible contact devices, the at least two second flexible contact devices of the switching device, the at least two first flexible contact devices of the semiconductor device, and the at least two contact areas on the switching surface lying opposite one another, each of the at least two first and second flexible contact elements having a basic body of a cured polymer with a metallized crest and a given expansion in a compressed state thereof, at least some of the at least two first and second flexible contact elements being compressed perpendicularly with respect to the surface, and at least one attachment element having a basic body of a cured polymer and an expansion in a direction perpendicular to the surface corresponding to the given expansion.

In accordance with again another feature of the invention, the semiconductor device is a plurality of semiconductor devices having the flexible contact elements applied at wafer level.

In accordance with again a further feature of the invention, the flexible contact elements are disposed at the semiconductor device and the attachment element is disposed at the semiconductor device.

In accordance with again an added feature of the invention, the flexible contact elements are disposed on the surface of the semiconductor device and the attachment element is disposed on the surface of the semiconductor device.

In accordance with again an additional feature of the invention, the flexible contact elements are conical basic bodies of a cured polymer and each of the conical basic bodies has a metallized crest and a metallized conductor track leading to the metallized crest. The flexible contact elements and the attachment elements, preferably, have a conical form.

In accordance with still another feature of the invention, the attachment elements are formed with a metallized crest. The material of the conductor tracks, and also of the metallization of the crests of the flexible contact elements and of the attachment elements, is, preferably, a gold alloy.

In accordance with still a further feature of the invention, the attachment elements are either adhesively bonded to the surface of the switching device lying opposite the semiconductor device by an adhesive or are soldered to metallized regions lying opposite of the switching device. For the soldering, metallization of the attachment elements is a prerequisite here. The adhesive bonding is possible both in the case of metallized attachment devices and non-metallized attachment devices. The adhesive is, preferably, an epoxy resin adhesive.

In accordance with still an added feature of the invention, the semiconductor devices are semiconductor memory devices, and also semiconductor devices that contain semiconductor memory devices, and, in particular, DRAMs and semiconductor devices that contain DRAMs.

In accordance with a concomitant feature of the invention, the switching device is a printed circuit board or a semiconductor device (chip stacking, 3D).

Other features that are considered as characteristic for the invention are set forth in the appended claims.

Although the invention is illustrated and described herein as embodied in a method of attaching semiconductor devices on a switching device and such a semiconductor device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 4A is a diagrammatic, cross-sectional view of a flexible contact element of FIGS. 1A to 1C;

FIG. 4B is a diagrammatic, plan view of the flexible contact element of FIGS. 1A to 1C;

FIG. 5 is a diagrammatic, cross-sectional view of an attachment element of FIGS. 1A to 1C;

FIG. 6 is a diagrammatic plan view of a surface of a semiconductor device facing the switching device according to FIGS. 1A to 1C; and FIG. 7 is a diagrammatic, cross-sectional view of a semiconductor device attached on a switching device by flip-chip technology according to the invention.

DESCRIPTION OF THE PREFERRED EMBODIMENTS

Figure 1A:
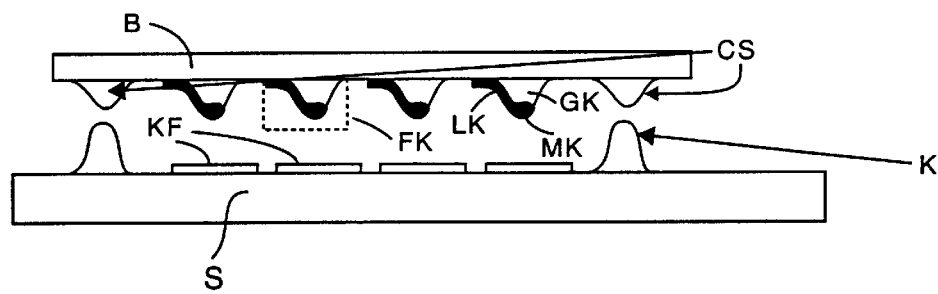
FIGS. 1A, 1B, and 1C are diagrammatic cross-sectional views illustrating three steps of a method of attaching semiconductor devices on a switching device according to a first exemplary embodiment of the invention.
Figure 1B:
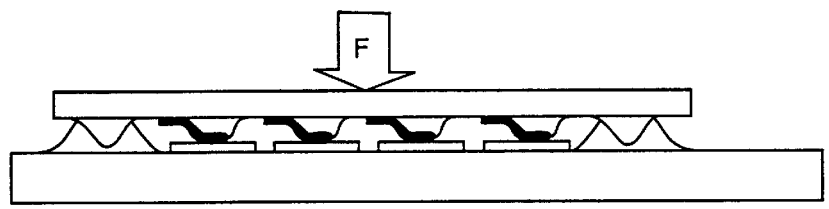
Figure 1C:
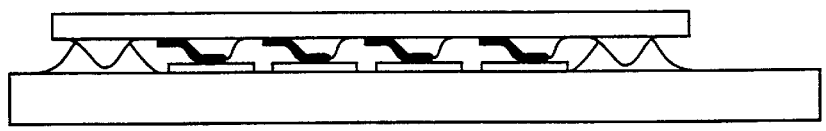

Referring now to the figures of the drawings in detail and first, particularly to FIGS. 1A to 1C thereof, there is shown the placement process of a component B in three phases, with compression stops CS, subsequently used as attachment elements, and flexible contact elements FK, on a switching device S with contact areas KF, based upon a first method according to the invention. For the sake of simplicity, only two compression stops CS, four contact areas KF, and four flexible contact elements FK are represented.

The compression stops CS include a basic body of silicone and can be metallized or non-metallized. They are represented here without metallization. The flexible contact elements FK are basic bodies GK of silicone with a metallized crest MK and a conductor track LK of the same material as the metallization connected thereto. The material of the metallization is a gold alloy. The switching device S is a printed circuit board.

Phase 1 (top; FIG. 1A) shows the component B and the switching device S before placement, after an adhesive K has been applied to the switching device S opposite the compression stops CS.

Phase 2 (middle; FIG. 1B) shows the placement process itself. In phase 2, the component B is pressed with a force F against the switching device S during the curing of the adhesive K, the flexible contact elements FK being compressed and the compression stops CS limiting the compressive displacement of the flexible contact elements FK.

Phase 3 (bottom; FIG. 1C) shows the component B placed on the switching device S. The electrical bonding takes place through the metallized crests MK, which are pressed by the spring force of the elastic basic body GK onto the contact areas KF lying opposite. The compression stops CS now act as mechanical attachment elements.

Figure 2A:
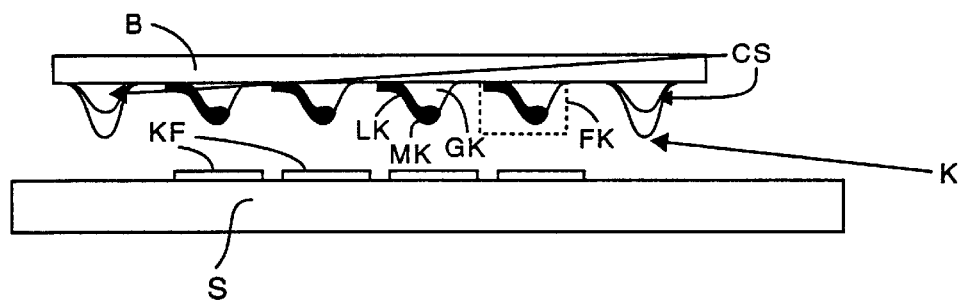
FIGS. 2A, 2B, and 2C are diagrammatic cross-sectional views illustrating a second exemplary embodiment of FIGS. 1A to 1C.
Figure 2B:
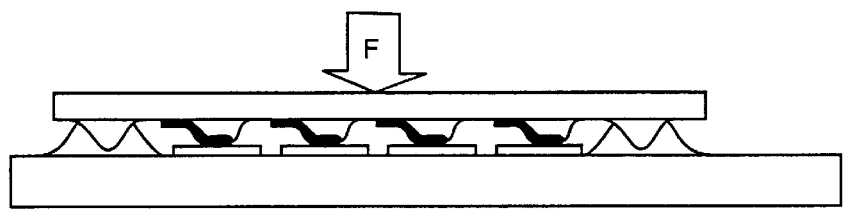
Figure 2C:
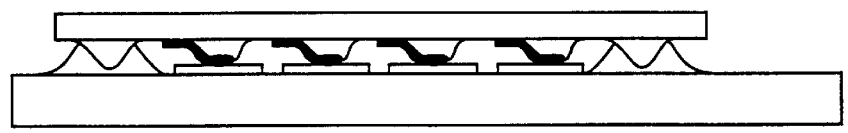

FIGS. 2A to 2C show the placement process of a component B in three phases, with compression stops CS, subsequently used as attachment elements, and flexible contact elements FK, on a switching device S with contact areas KF, based upon a second method according to the invention. For the sake of simplicity, only two compression stops CS, four contact areas KF, and four flexible contact elements FK are represented.

The compression stops CS include a basic body GK of silicone and can be metallized or non-metallized. They are represented here without metallization. The flexible contact elements FK are basic bodies GK of silicone with a metallized crest MK and a conductor track LK of the same material as the metallization connected to the latter. The material of the metallization is a gold alloy. The switching device S is a printed circuit board.

Phase 1 (top; FIG. 2A) shows the component B and the switching device S before the placement process, after an adhesive K has been applied to the compression stops CS of the component B used as attachment elements.

Phase 2 (middle; FIG. 2B) shows the placement process itself, in which the component B is pressed with a force F against the switching device S during the curing of the adhesive K, the flexible contact elements FK being compressed and the compression stops CS limiting the compressive displacement of the flexible contact elements FK.

Phase 3 (bottom; FIG. 2C) shows the component B placed on the switching device S. The electrical bonding takes place through the metallized crests MK, which are pressed by the spring force of the elastic basic body GK onto the contact areas KF lying opposite. The compression stops CS act as mechanical attachment elements.

Figure 3A:
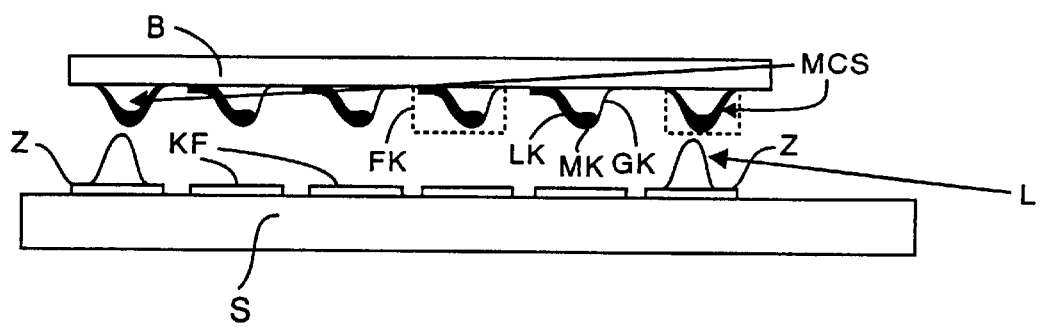
FIGS. 3A, 3B, and 3C are diagrammatic cross-sectional views illustrating a third exemplary embodiment of FIGS. 1A to 1C.
Figure 3B:
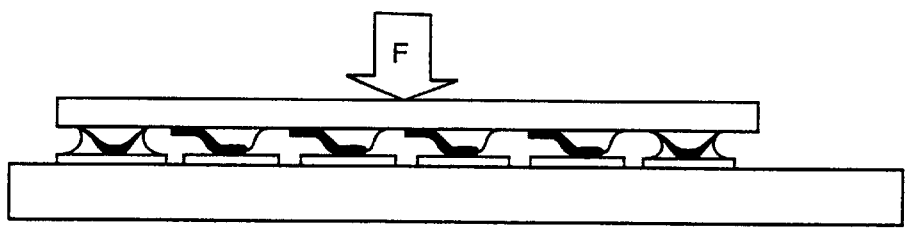
Figure 3C:
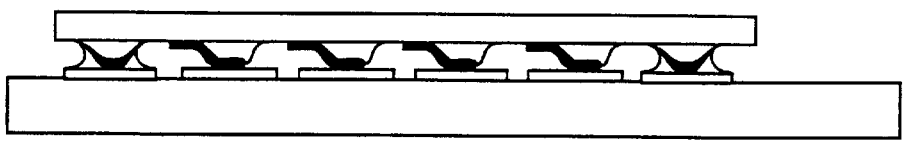

FIGS. 3A to 3C show the placement process of a component B in three phases based upon a third embodiment of the method according to the invention. In such a process, a component B with metallized compression stops MCS, subsequently used as attachment elements, and flexible contact elements FK including an elastic basic body GK with a metallized crest MK, is connected on a switching device S to the contact areas KF lying opposite the flexible contact elements FK and to the metallized regions Z lying opposite the metallized compression stops MCS. To simplify the representation, only two metallized compression stops MCS, two metallized regions Z, four flexible contact elements FK, and four contact areas KF are represented.

Phase 1 (top; FIG. 3A) shows the component B and the switching device S before the placement process, after solder has been applied to the metallized regions Z of the switching device S.

Phase 2 (middle; FIG. 3B) shows the component B and the switching device S during the soldering operation. In such an operation, the component B is pressed by a force F against the switching device S during the soldering, the flexible contact elements FK being compressed and the compression stops CS limiting the compressive displacement of the flexible contact elements FK.

Phase 3 (bottom; FIG. 3C) shows the component B placed on the switching device S. The electrical bonding takes place through the metallized crests MK of the flexible contact elements FK, which are pressed by the spring force of the elastic basic body GK onto the contact areas KF lying opposite. The soldered connection between the metallized compression stops MCS and the metallized regions Z serves as mechanical attachment of the component on the switching device S. The electrical contact elements remain free of solder.

FIGS. 4A and 4B show a flexible contact element FK in a particularly preferred embodiment in a side view (FIG. 4A) and a plan view (FIG. 4B). An elastic, conical basic body GK of silicone several μm high is metallized on the crest with a gold alloy. A conductor track LK of the same material as the metallization is connected to the metallized region MK.

FIG. 5 shows a metallized compression stop MCS, used as an attachment element, in a particularly preferred embodiment. The crest of a conical, elastic basic body GK of silicone several μm high is coated with an electrically conducting layer MS.

FIG. 6 shows the surface of a component B lying opposite the switching device S in plan view. It carries metallized compression stops MCS and flexible contact elements KF with metallized crests MK, which are electrically connected to corresponding bonding pads BP by conductor tracks LK. The compression stops MCS are disposed at the edge of the component.

FIG. 7 shows a component B that is attached on a switching device S by conventional flip-chip technology. Provided for such a purpose on the component B as electrical contact devices are what are referred to as solder bumps BU, which are soldered to contact areas KF lying opposite on the switching device S. As a result, the component B is mechanically attached on the switching device S and, at the same time, is electrically bonded. In addition, the component B is embedded in an underfiller UF, which protects the component B and the soldered connections from thermally induced mechanical stresses.

We claim:

1. A method of attaching a semiconductor device on a switching device, which comprises:
   providing a semiconductor device with at least two electrical contact devices on a surface;
   providing a switching device with at least two electrical contact devices on a surface;
   forming the electrical contact devices on one of the two surfaces as flexible contact elements having a given expansion in a compressed state of the flexible contact elements;
   forming the electrical contact devices on the other of the two surfaces as contact areas;
   applying at least one attachment element to one of the two surfaces, the at least one attachment element having an expansion in a direction perpendicular to the one surface corresponding to the given expansion; and
   facing the semiconductor device towards the switching device to place the respective electrical contact devices opposite one another, pressing the flexible contact elements onto the contact areas, and securely connecting the at least one attachment element to an opposing other one of the two surfaces.

2. The method according to claim 1, which further comprises applying the contact devices of the semiconductor device at wafer level.

3. The method according to claim 1, which further comprises applying the flexible contact elements and the attachment element respectively to the semiconductor device.

4. The method according to claim 1, which further comprises:
   forming the flexible contact elements on the surface of the semiconductor device; and
   applying the attachment element to the semiconductor device.

5. The method according to claim 3, which further comprises:
   providing the semiconductor device with bonding pads;
   applying the flexible contact elements and the attachment element to the semiconductor device by applying a polymer to the surface of the semiconductor device with a perforated mask and subsequently curing the polymer to produce basic bodies of elastic polymer, the basic bodies having crests;
   creating the flexible contact elements by metallizing the crests of the basic bodies; and
   applying conductor tracks between the metallic crests of the basic bodies and corresponding ones of the bonding pads.

6. The method according to claim 5, which further comprises:
   providing the semiconductor device with an edge and an inner contact field;
   applying the flexible contact elements at the inner contact field; and
   providing at least two attachment elements in a region of the semiconductor device between the edge and the inner contact field.

7. The method according to claim 5, which further comprises:
   applying the flexible contact elements at an inner contact field of the semiconductor device; and
   providing at least two attachment elements in a region of the semiconductor device between an edge of the semiconductor device and the inner contact field.

8. The method according to claim 1, wherein the attachment element is at least one mechanical stop limiting compressive displacement of the flexible contact elements.

9. The method according to claim 1, which further comprises adhesively bonding the attachment element to the surface of the switching device with an adhesive.

10. The method according to claim 9, which further comprises applying the adhesive before the attachment element is adhesively bonded to the surface of the switching device.

11. The method according to claim 9, which further comprises applying the adhesive to the switching device before the attachment element is adhesively bonded to the surface of the switching device.

12. The method according to claim 9, wherein the adhesive is an epoxy resin adhesive.

13. The method according to claim 1, which further comprises metallizing the attachment element.

14. The method according to claim 1, wherein the attachment element is a plurality of attachment elements and which further comprises metallizing the attachment elements.

15. The method according to claim 1, wherein the attachment element is a plurality of attachment elements on the semiconductor device and which further comprises:

metallizing the attachment elements to form metallized attachment elements;

metallizing regions of the switching device opposite the metallized attachment elements; and attaching the semiconductor device to the surface of the switching device by soldering the metallized attachment elements to the opposing metallized regions on the switching device.

16. A method of attaching a semiconductor device on a switching device, which comprises:

providing a semiconductor device with at least two electrical contact devices on a surface;

providing a switching device with at least two electrical contact devices on a surface;

forming the electrical contact devices on one of the two surfaces as flexible contact elements having a given expansion in a compressed state of the flexible contact elements;

forming the electrical contact devices on the other of the two surfaces as contact areas;

applying at least one attachment element to one of the two surfaces, the at least one attachment element having an expansion in a direction perpendicular to the one surface corresponding to the given expansion; and facing the semiconductor device towards the switching device to place the respective electrical contact devices opposite one another, pressing the semiconductor device and the switching device to contact the flexible contact elements and the contact areas with one another, and securely connecting the at least one attachment element to an opposing other one of the two surfaces.

17. A method of attaching a semiconductor device to a switching device, which comprises:

a) providing a semiconductor device with a surface and at least two bonding pads on the surface, and providing a switching device with a switching surface and at least two electrical contact areas on the switching surface to face the semiconductor device to be attached thereto;

b) applying elastic polymer to the semiconductor device with a perforated mask and subsequently curing the polymer to produce basic bodies in the form of attachment elements and flexible contact elements;

c) forming the flexible contact elements by metallizing crests of at least some of the basic bodies;

d) forming conductor tracks between the metallized crests of the basic bodies on the semiconductor device and the at least two bonding pads of the semiconductor device;

e) aligning the semiconductor device and the switching device with respect to one another;

f) pressing the flexible contact elements of the semiconductor device to the at least two electrical contact areas disposed opposite thereof at the switching device; and g) securely connecting at least one of the attachment elements to at least one of the surface and the switching surface lying opposite the attachment elements in a compressed state of the flexible contact elements.

18. The method according to claim 17, which further comprises carrying out the pressing step by pressing the flexible contact elements of the semiconductor device onto the at least two electrical contact areas.

* * * * *